United States Patent
Kim et al.

(10) Patent No.: US 9,391,616 B2
(45) Date of Patent: Jul. 12, 2016

(54) NOISE ELIMINATION CIRCUIT OF SEMICONDUCTOR APPARATUS

(71) Applicant: SK hynix Inc., Icheon-si Gyeonggi-do (KR)

(72) Inventors: Chang Hyun Kim, Icheon-si (KR); Choung Ki Song, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/156,191

(22) Filed: Jan. 15, 2014

(65) Prior Publication Data

US 2015/0091612 A1  Apr. 2, 2015

(30) Foreign Application Priority Data

Sep. 30, 2013  (KR) .................. 10-2013-0116281

(51) Int. Cl.
*H03K 19/003* (2006.01)
*H03K 5/1252* (2006.01)

(52) U.S. Cl.
CPC ........ *H03K 19/00361* (2013.01); *H03K 5/1252* (2013.01)

(58) Field of Classification Search
CPC ........ G11C 8/18; H04L 7/033; H03K 3/0375; H03K 5/1534; H03K 3/0372; H03K 17/223; H03K 19/00346; H03K 19/00369; H03K 5/05; H03K 5/1532; H03K 5/26
See application file for complete search history.

(56) References Cited

U.S. PATENT DOCUMENTS 5,636,177 A * 6/1997 Fu ............................... 365/233.5
6,064,237 A * 5/2000 Lee ..................... H03K 5/1252
                                                             327/31
7,394,712 B2   7/2008 Do

FOREIGN PATENT DOCUMENTS

KR   1019890006664 Y1   9/1989

* cited by examiner

*Primary Examiner* — Jany Richardson
(74) *Attorney, Agent, or Firm* — William Park & Associates Ltd.

(57) ABSTRACT

A semiconductor apparatus includes a pulse generation unit configured to detect a transition of an input signal and generate a preliminary pulse signal, and an error elimination unit configured to determine error of the preliminary pulse signal and output a signal as a pulse signal.

12 Claims, 6 Drawing Sheets

NOISE ELIMINATION CIRCUIT OF SEMICONDUCTOR APPARATUS

CROSS-REFERENCES TO RELATED APPLICATION

The present application claims priority under 35 U.S.C. §119(a) to Korean application number 10-2013-0116281, filed on Sep. 30, 2013, in the Korean Intellectual Property Office, which is incorporated herein by reference in its entirety.

BACKGROUND

1. Technical Field

Various embodiments relate to a semiconductor apparatus, and more particularly, to a noise elimination circuit of a semiconductor apparatus.

2. Related Art

A semiconductor apparatus may use various signals for the operation control thereof, for example, a pulse-type signal and a level signal.

The level signal may be a signal which retains a high level or a low level until a variation in an input condition occurs.

A conventional level signal processing circuit 10 will be exemplarily described with reference to FIG. 1.

As shown in FIG. 1, the level signal processing circuit 10 includes a plurality of flip-flops (F/F) 11, 12, 13 and 15, and a decoder 14.

The plurality of respective flip-flops 11 to 13 latch input signals A to C according to a clock signal CLK and generate output signals FF1 to FF3.

The decoder 14 decodes the output signals FF1 to FF3 and generates a level signal LS.

The flip-flop 15 latches an input signal D according to a clock signal CLK2 and generates an output signal FF_OUT.

In the flip-flop 15, the output signal FF_OUT may be initialized to, for example, a low level, in response to the level signal LS.

Referring to FIG. 2, in the case of a normal operation, the output signals FF1 to FF3 should have the same timing.

However, in an actual operation, any one of the output signals FF1 to FF3, for example, the output signal FF2 may be abnormally generated or may have erroneous timing due to a variation in PVT (process/voltage/temperature).

In the case where the output signals FF1 to FF3 have the same timing, the level signal LS may be retained to, for example, a high level.

However, if the output signal FF2 has different timing as mentioned above, the level signal LS may not have a normal level and may be generated in the type of noise, that is, a glitch, which is problematic.

In this way, in the case where the level signal LS does not have a normal level and is generated in the glitch type, the flip-flop may be abnormally initialized.

Accordingly, a problem is likely to be caused in that the output signal FF_OUT of the flip-flop 15 may have an erroneous level, that is, a level different from a desired level.

SUMMARY

Various embodiments are directed to a noise elimination circuit of a semiconductor apparatus capable of eliminating noise included in a level signal.

In an embodiment of the present invention, a noise elimination circuit of a semiconductor apparatus may include: a pulse generation unit configured to detect a transition of an input signal and generate a preliminary pulse signal; and an error elimination unit configured to determine an error of the preliminary pulse signal, and output a signal as a pulse signal.

In an embodiment of the present invention, a noise elimination circuit of a semiconductor apparatus may include: a pulse generation unit configured to detect a transition of an input signal and generate a preliminary pulse signal; and a filter configured to eliminate noise of the preliminary pulse signal and generate a pulse signal.

The input signal may be a signal which retains a high level or a low level until a variation in an operating condition of the semiconductor apparatus occurs.

In an embodiment of the present invention, a noise elimination circuit of a semiconductor apparatus may include: a pulse generation unit configured to detect a transition of an input signal and generate a preliminary pulse signal; and a slicer configured to eliminate the preliminary pulse signal in correspondence to a predetermined period and output a pulse signal.

BRIEF DESCRIPTION OF THE DRAWINGS

Features, aspects, and embodiments are described in conjunction with the attached drawings, in which.

DETAILED DESCRIPTION

Hereinafter, a noise elimination circuit of a semiconductor apparatus according to the invention will be described with reference to the accompanying drawings through various embodiments.

Figure 1:
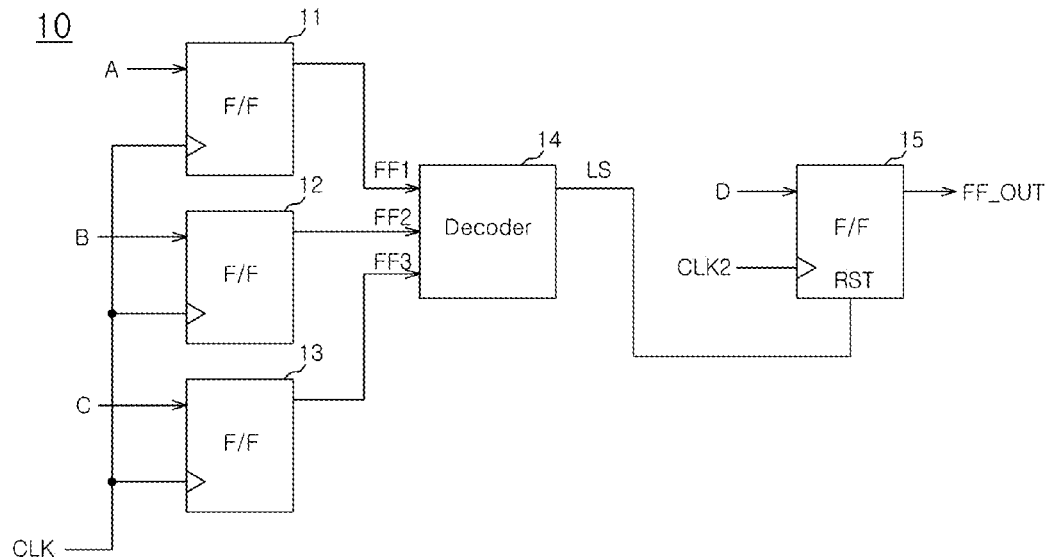
FIG. 1 is a block diagram of a conventional level signal processing circuit.
Figure 2:
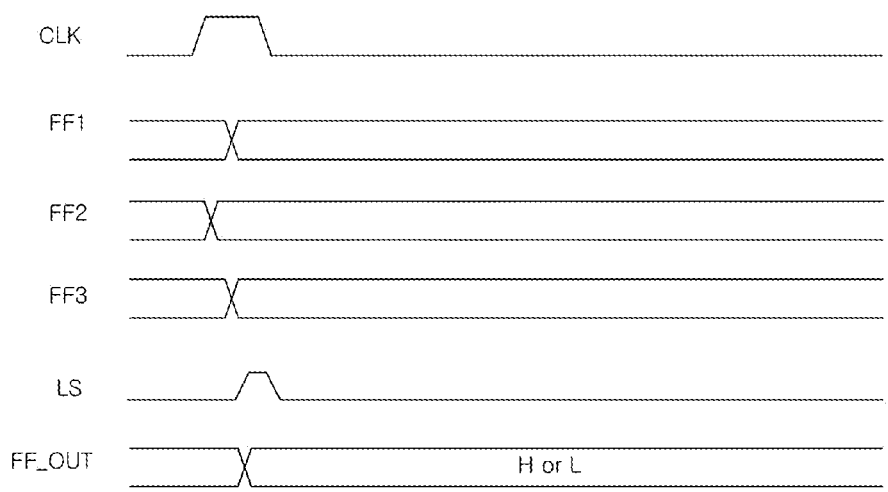
FIG. 2 is an output waveform diagram according to FIG. 1.
Figure 3:
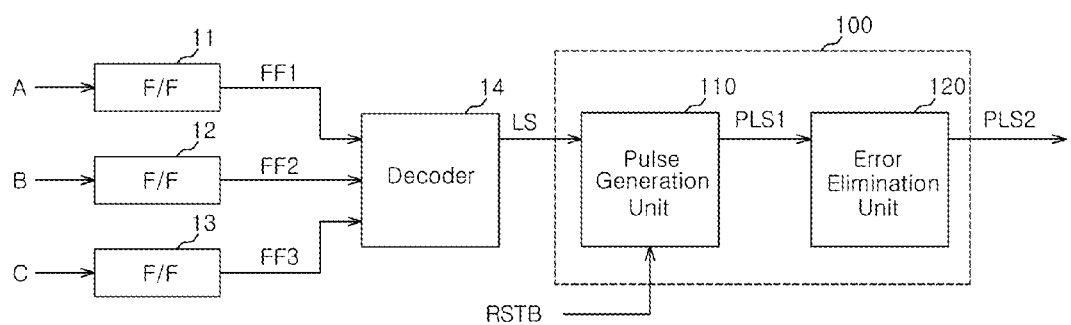
FIG. 3 is a block diagram of a noise elimination circuit of a semiconductor apparatus in accordance with an embodiment of the present disclosure.

As shown in FIG. 3, a noise elimination circuit 100 of a semiconductor apparatus in accordance with an embodiment of the present disclosure may include a pulse generation unit 110, and an error elimination unit 120.

The pulse generation unit 110 may be configured to detect a transition of an input signal LS, that is, a level signal, and generate a preliminary pulse signal PLS1 having a predetermined width.

The level signal may be a signal which retains a high level or a low level until a variation in an operating condition of the semiconductor apparatus occurs.

The pulse generation unit 110 may be configured to detect a transition of the input signal LS from the low level to the high level, and generate the preliminary pulse signal PLS1 having the predetermined width.

The input signal LS may be generated through a plurality of flip-flops (F/F) 11 to 13 and a decoder 14.

The plurality of respective flip-flops 11 to 13 latch input signals A to C according to a clock signal CLK, and generate output signals FF1 to FF3.

The decoder 14 decodes the output signals FF1 to FF3 and generates the input signal LS.

The error elimination unit 120 may be configured to determine an error of the preliminary pulse signal PLS1 and output a signal from which an error component is eliminated, as a pulse signal PLS2.

The error elimination unit 120 may be constituted by a low pass filter, or wherein a filter comprises a low pass filter.

Therefore, the error elimination unit 120 may be configured to eliminate a glitch component of the preliminary pulse signal PLS1, and generate the pulse signal PLS2.

Figure 4:
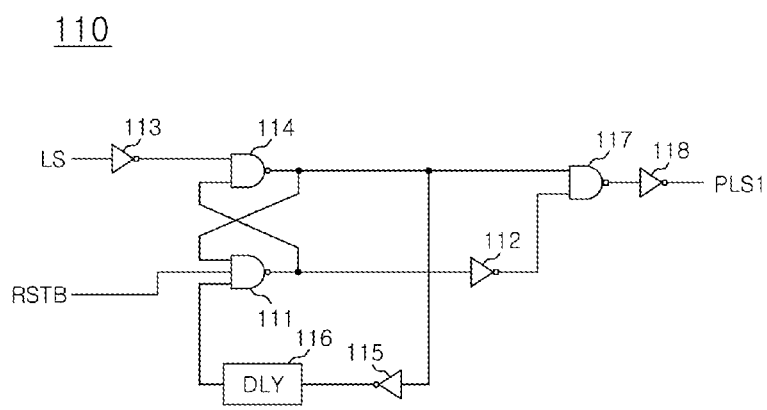
FIG. 4 is a circuit diagram of the pulse generation unit of FIG. 3.

As shown in FIG. 4, the pulse generation unit 110 may include a plurality of logic gates 111 to 115, 117 and 118, and a delay (DLY) 116.

A reset signal RSTB also illustrated in FIG. 3 transitions to a low level for a predetermined time, and then transitions to a high level.

The logic gate 111 outputs a high level signal as the reset signal RSTB is activated to the low level, and accordingly, the preliminary pulse signal PLS1 is initialized to a low level.

As the input signal LS transitions from the low level to the high level, the logic gate 114 outputs a high level signal.

The delay 116 delays and outputs the high level signal outputted from the logic gate 115 when the input signal LS is the low level.

When the reset signal RSTB transitions to the high level and the logic gate 114 outputs the high level signal, the logic gate 111 outputs a low level signal.

At this time, since the logic gate 114 outputs the high level signal, the preliminary pulse signal PLS1 transitions to the high level.

Thereafter, the delay 116 delays and outputs the low level signal outputted from the logic gate 115.

Accordingly, the preliminary pulse signal PLS1 transitions again to the low level through the logic gates 111, 112, 117 and 118.

As a result, as the input signal LS transitions to the high level, the preliminary pulse signal PLS1 having a high pulse width corresponding to the delay time of the delay 116 is generated.

Figure 5:
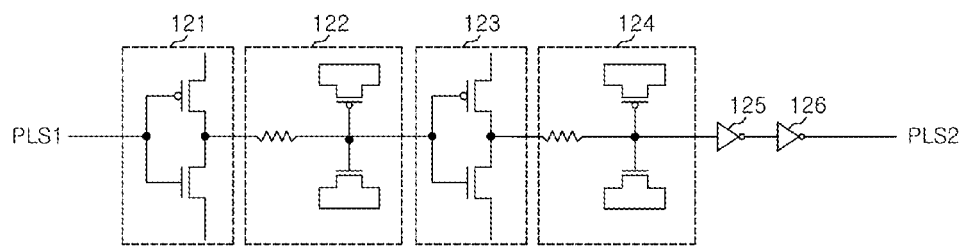
FIG. 5 is a circuit diagram of the error elimination unit of FIG. 3.

As shown in FIG. 5, the error elimination unit or slicer 120 may include a plurality of inverters 121, 123, 125 and 126, and a plurality of delays 122 and 124.

Each of the delays 122 and 124 may be constituted by a resistor and capacitors.

The error elimination unit 120 does not pass the preliminary pulse signal PLS1 when the preliminary pulse signal PLS1 is a high frequency component, that is, noise.

Figure 6A:
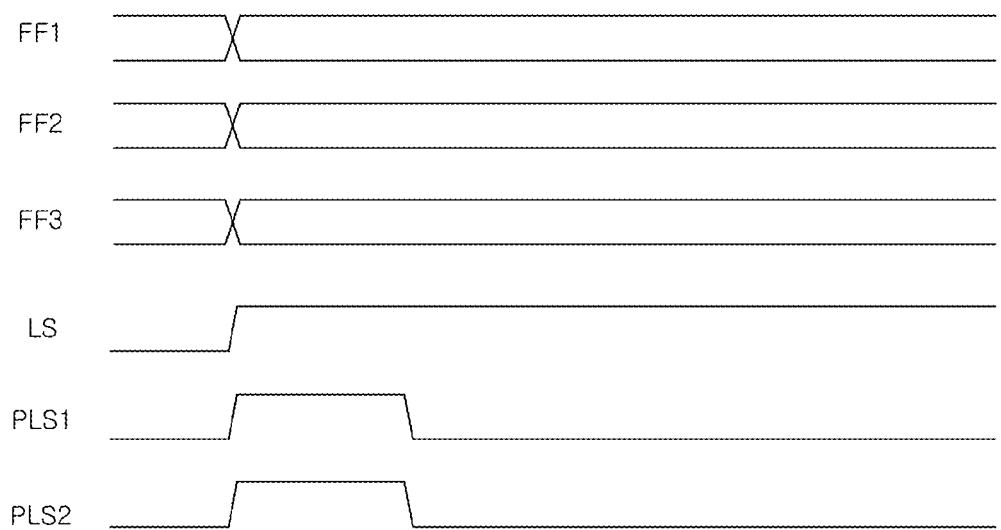
FIGS. 6a and 6b are output waveform diagrams of FIG. 3.

As shown in FIG. 6a, in a normal case, the output signals FF1 to FF3 of the plurality of flip-flops 11 to 13 have the same timing.

The decoder 14 decodes the output signals FF1 to FF3 and generates the input signal LS which retains the high level.

The pulse generation unit 110 detects a transition of the input signal LS to the high level, and generates the preliminary pulse signal PLS1 having the predetermined width.

At this time, the preliminary pulse signal PLS1 is not noise but a normal signal which has a pulse width equal to or larger than the predetermined width.

Therefore, the error elimination unit 120 outputs the preliminary pulse signal PLS1 as the pulse signal PLS2 (also illustrated in FIG. 5).

Figure 6B:
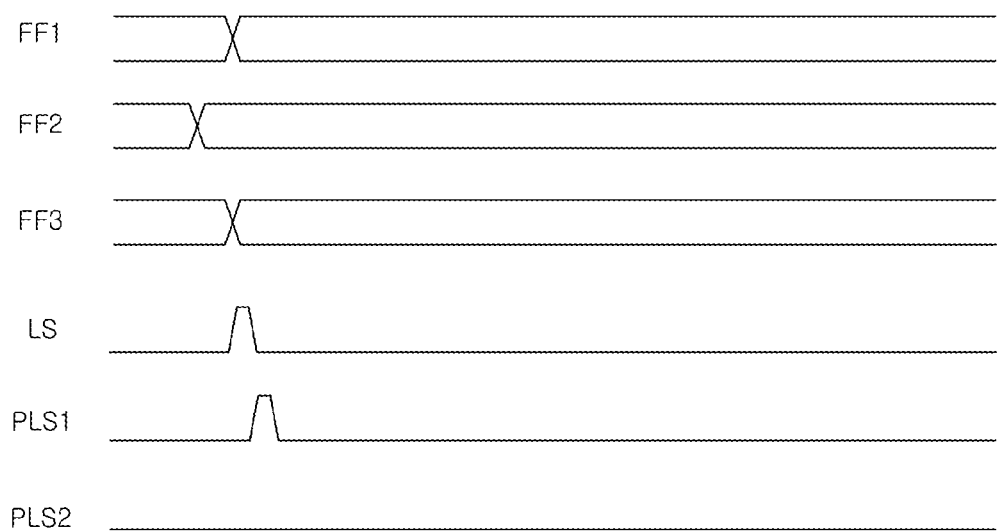

As shown in FIG. 6b, in an abnormal case, any one of the output signals FF1 to FF3 of the flip-flops 11 to 13, for example, the output signal FF2 may have different timing from the other signals.

The decoder 14 decodes output signals FF1 to FF3 and generates the input signal LS of a glitch type.

The pulse generation unit 110 generates the preliminary pulse signal PLS1 with a pulse width less than the predetermined width according to the input signal LS of the glitch type.

At this time, the swing width of the input signal LS of the glitch type may not be a desired level.

Therefore, the pulse generation unit 110 may not generate the preliminary pulse signal PLS1 having a pulse width of a normal level.

The error elimination unit 120 eliminates the preliminary pulse signal PLS1 and retains the pulse signal PLS2 at the low level.

The input signal LS of the glitch type is an abnormal signal. Therefore, an embodiment of the present disclosure, the input signal LS of the glitch type is determined as noise, such that the pulse signal PLS2 is not activated.

Figure 7:
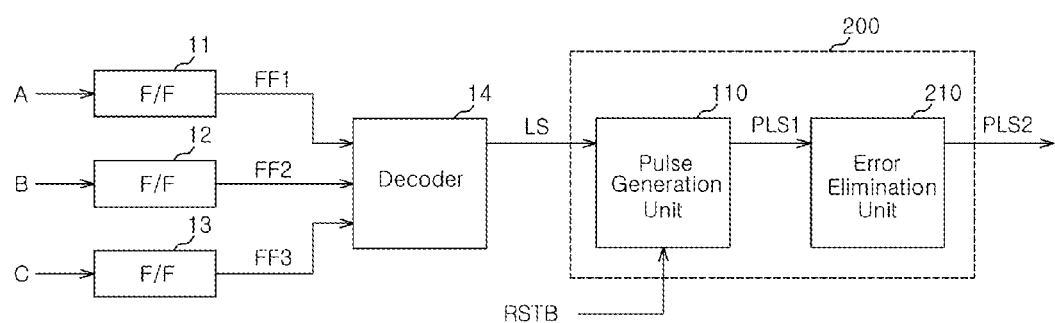
FIG. 7 is a block diagram of a noise elimination circuit of a semiconductor apparatus in accordance with an embodiment of the present disclosure.

As shown in FIG. 7, a noise elimination circuit 200 of a semiconductor apparatus in accordance with an embodiment of the present disclosure may include a pulse generation unit 110 and an error elimination unit 210.

The pulse generation unit 110 may be configured to detect a transition of an input signal LS, that is, a level signal, and generate a preliminary pulse signal PLS1 having a predetermined width.

The pulse generation unit 110 may be configured to detect a transition of the input signal LS from a low level to a high level, and generate the preliminary pulse signal PLS1 having the predetermined width.

The pulse generation unit 110 may be configured as shown in FIG. 4.

The input signal LS may be generated through a plurality of flip-flops (F/F) 11 to 13 and a decoder 14.

The plurality of respective flip-flops 11 to 13 latch input signals A to C according to a clock signal CLK, and generate output signals FF1 to FF3.

The decoder 14 decodes the output signals FF1 to FF3 and generates the input signal LS.

The error elimination unit 210 may be configured to determine an error of the preliminary pulse signal PLS1, and output a signal from which an error component is eliminated, as a pulse signal PLS2.

The error elimination unit or slicer 210 may be configured to eliminate a signal or the preliminary pulse signal PLS1 corresponding to a predetermined period, from a transition time of the preliminary pulse signal PLS1, and output the pulse signal PLS2.

Figure 8:
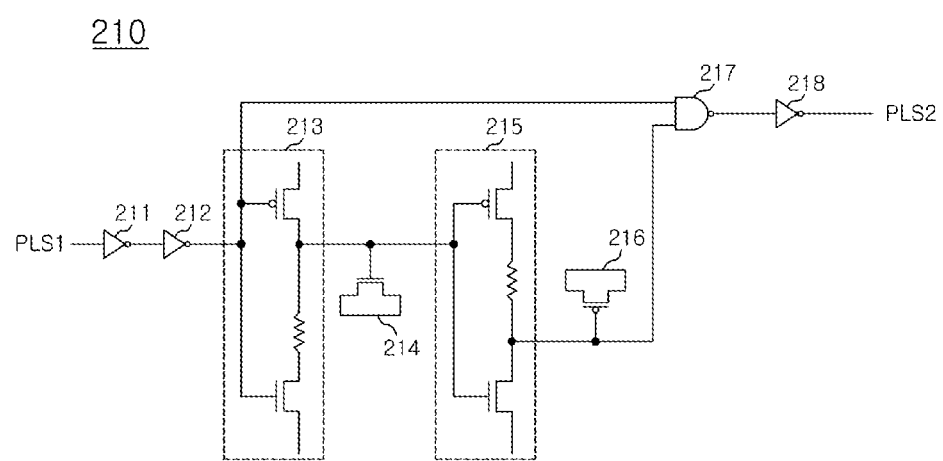
FIG. 8 is a circuit diagram of the error elimination unit of FIG. 7.

As shown in FIG. 8, the error elimination unit or slicer 210 may include a plurality of inverters 211, 212, 213 and 215, a plurality of capacitors 214 and 216, and a plurality of logic gates 217 and 218.

The inverter 213 is in a state which the output signal of the inverter 213 is precharged to a high level when the preliminary pulse signal PLS1 is a low level.

When the preliminary pulse signal PLS1 transitions to the high level, it takes a time for the output signal to transition to a low level, by which the inverter 213 may serve as a delay.

Likewise, the inverter 215 operates as a delay which transitions the output signal thereof from a low level to a high level. Moreover, the error elimination unit or slicer 210 may be configured to delay a transition of the output signal of the inverters 211, 212, 213 and 215 according to a transition of the preliminary pulse signal PLS1.

While one of the inputs of the logic gate 217 transitions to a high level as the preliminary pulse signal PLS1 becomes the high level, the other of the inputs may transition to a high level after delay times by the inverters 213 and 215 and the capacitors 214 and 216 have passed.

By eliminating the signal corresponding to the predetermined period from the rising edge of the preliminary pulse signal PLS1 according to the operation principle mentioned above, the error elimination unit 210 may generate the pulse signal PLS2 having the pulse width which is decreased when compared to the preliminary pulse signal PLS1.

If the preliminary pulse signal PLS1 is noise, the pulse width thereof may be smaller than the period eliminated by the error elimination unit 210.

Therefore, the error elimination unit 210 may eliminate the preliminary pulse signal PLS1 of the glitch type.

Figure 9A:
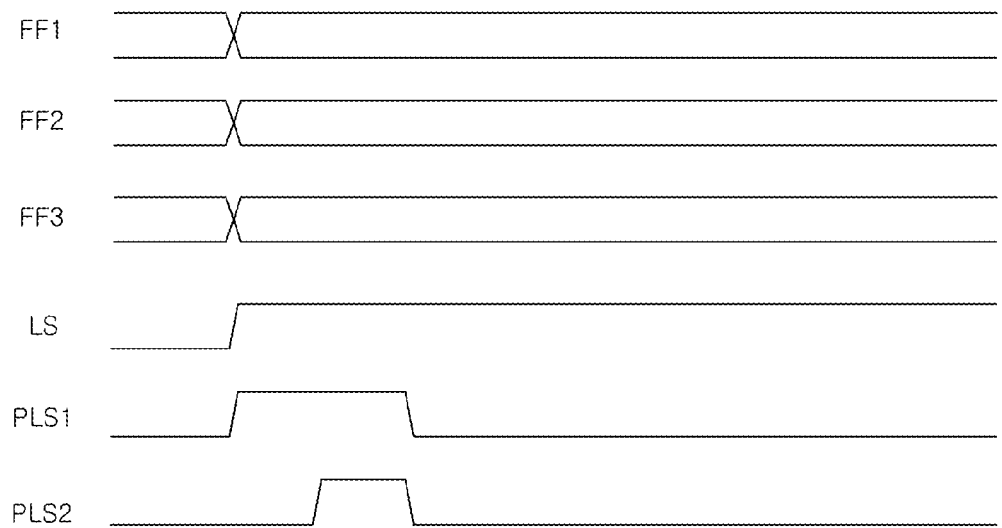
FIGS. 9a and 9b are output waveform diagrams of FIG. 7.

As shown in FIG. 9a, in a normal case, the output signals FF1 to FF3 of the flip-flops 11 to 13 have the same timing.

The decoder 14 decodes the output signals FF1 to FF3 and generates the input signal LS which retains the high level.

The pulse generation unit 110 detects a transition of the input signal LS to the high level and generates the preliminary pulse signal PLS1 having the predetermined width.

At this time, the preliminary pulse signal PLS1 is a normal signal having a pulse width equal to or larger than a period which the error elimination unit 210 eliminates.

Therefore, the error elimination unit 210 outputs the pulse signal PLS2 (also illustrated in FIG. 8) having a pulse width smaller than the preliminary pulse signal PLS1.

Figure 9B:
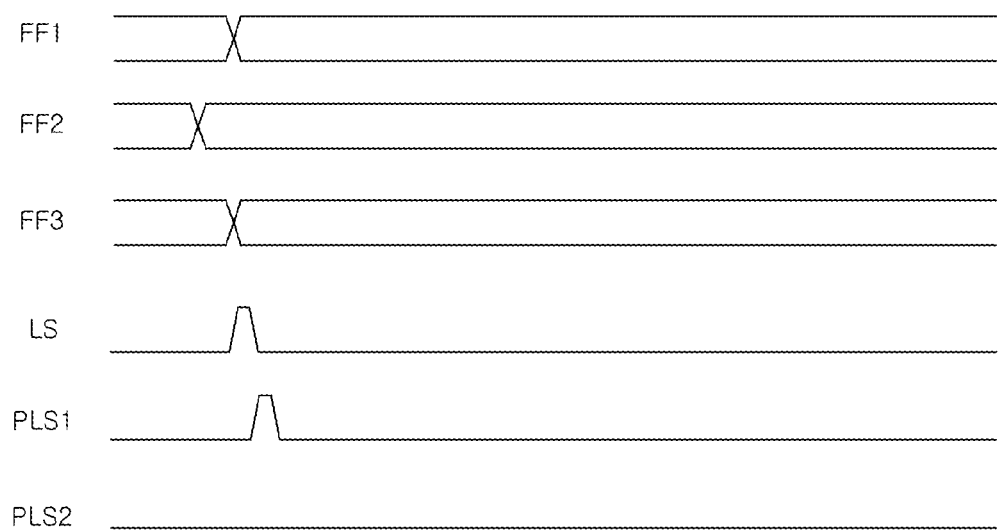

As shown in FIG. 9b, in an abnormal case, any one of the output signals FF1 to FF3 of the flip-flops 11 to 13, for example, the output signal FF2 may have different timing from the other signals.

The decoder 14 decodes the output signals FF1 to FF3 and generates the input signal LS of the glitch type.

The pulse generation unit 110 generates the preliminary pulse signal PLS1 of the same glitch type as the input signal LS, according to the input signal LS of the glitch type.

In the error elimination unit 210 which eliminates a predetermined period from the rising edge of an input signal, since the preliminary pulse signal PLS1 is the glitch type, the error elimination unit 210 eliminates the preliminary pulse signal PLS1 and retains the pulse signal PLS2 at a low level.

The input signal LS of the glitch type is an abnormal signal. Therefore, in an embodiment of the present disclosure, the input signal LS of the glitch type is determined as noise, such that the pulse signal PLS2 is not activated.

While certain embodiments have been described above, it will be understood to those skilled in the art that the embodiments described are by way of example only. Accordingly, the noise elimination circuit of a semiconductor apparatus described herein should not be limited based on the described embodiments. Rather, the noise elimination circuit of a semiconductor apparatus described herein should only be limited in light of the claims that follow when taken in conjunction with the above description and accompanying drawings.

What is claimed is:

1. A noise elimination circuit of a semiconductor apparatus, comprising:
    a pulse generation unit configured to detect a transition of an input signal and generate a preliminary pulse signal; and
    a slicer configured to generate a pulse signal by eliminating a part of the preliminary pulse signal corresponding to a predetermined period from a transition time of the preliminary pulse signal.

2. The noise elimination circuit according to claim 1, wherein the input signal is a signal which retains a high level or a low level until a variation of an operation condition of the semiconductor apparatus occurs.

3. The noise elimination circuit according to claim 1, further comprising:
    a plurality of flip-flops configured to respectively latch input signals and generate output signals; and
    a decoder configured to decode the output signals and generate the input signal.

4. The noise elimination circuit of the semiconductor apparatus according to claim 1, wherein the pulse generation unit is configured to detect a transition of the input signal from the low level to the high level and generate the preliminary pulse signal.

5. The noise elimination circuit of the semiconductor apparatus according to claim 1, wherein the slicer comprises a plurality of inverters and is configured to delay a transition of an output signal of the inverters according to a transition of the preliminary pulse signal.

6. The noise elimination circuit of the semiconductor apparatus according to claim 1, wherein the slicer is configured to output a pulse signal by eliminating an error component from the preliminary pulse signal.

7. The noise elimination circuit of the semiconductor apparatus according to claim 5, wherein one of the plurality of inverters is configured to serve as a delay when the preliminary pulse signal transitions from a low level to a high level.

8. The noise elimination circuit of the semiconductor apparatus according to claim 1, wherein the slicer is configured to generate the pulse signal with a pulse width less than a pulse width of the preliminary pulse signal.

9. The noise elimination circuit of the semiconductor apparatus according to claim 1, wherein the slicer is configured to eliminate the preliminary pulse signal and retain the pulse signal at a low level.

10. The noise elimination circuit of the semiconductor apparatus according to claim 9, wherein the pulse signal is not activated when the input signal is determined as noise.

11. A noise elimination circuit of a semiconductor apparatus, comprising:
    a pulse generation unit configured to detect a transition of an input signal and generate a preliminary pulse signal; and
    a slicer configured to generate a pulse signal by eliminating a part of the preliminary pulse signal corresponding to a predetermined period from a transition time of the preliminary pulse signal,
    wherein the slicer comprising:
    delays configured to be path through the preliminary pulse signal,
    logic gates configured to generate the pulse signal by performing a logical operation on the preliminary pulse signal and an output of the logic gates.

12. The noise elimination circuit of the semiconductor apparatus according to claim 11, wherein the delays include inverters and capacitors.

* * * * *